United States Patent
Carlson

(10) Patent No.: US 7,307,021 B1
(45) Date of Patent: Dec. 11, 2007

(54) METHOD FOR PLANARIZING A THIN FILM

(75) Inventor: David W. Carlson, Windham, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 162 days.

(21) Appl. No.: 09/678,414

(22) Filed: Oct. 2, 2000

(51) Int. Cl.
*H01L 21/461* (2006.01)

(52) U.S. Cl. .............................. 438/691; 257/E21.303; 257/E21.304

(58) Field of Classification Search ........ 438/689–699, 438/759; 216/89, 38, 88; 257/E21.303, 257/E21.304
See application file for complete search history.

(56) References Cited

U.S. PATENT DOCUMENTS

| 5,378,318 | A | * | 1/1995 | Weling et al. .............. 438/697 |
| 5,381,302 | A | * | 1/1995 | Sandhu et al. .............. 361/305 |
| 5,560,802 | A | * | 10/1996 | Chisholm .................... 438/692 |
| 5,618,381 | A | * | 4/1997 | Doan et al. ................. 438/633 |
| 5,688,720 | A | * | 11/1997 | Hayashi ...................... 438/633 |
| 5,783,488 | A | * | 7/1998 | Bothra et al. ............... 438/692 |
| 5,795,495 | A | * | 8/1998 | Meikle ......................... 216/38 |
| 5,872,043 | A | * | 2/1999 | Chen ........................... 438/424 |
| 5,981,354 | A | * | 11/1999 | Spikes et al. ............... 438/424 |
| 6,162,368 | A | * | 12/2000 | Li et al. ........................ 216/38 |
| 6,197,660 | B1 | * | 3/2001 | Jang et al. ................... 438/427 |
| 6,316,363 | B1 | * | 11/2001 | Blalock et al. ............. 156/345 |
| 6,331,488 | B1 | * | 12/2001 | Doan et al. ................. 438/698 |
| 6,348,415 | B1 | * | 2/2002 | Lee et al. .................... 438/692 |

* cited by examiner

*Primary Examiner*—Brook Kebede
(74) *Attorney, Agent, or Firm*—Mark C. Pickering

(57) ABSTRACT

A layer of required material, such as polysilicon, is planarized by first forming a sacrificial layer of material, such as an oxide, on the layer of required material. The combined layers of required and sacrificial materials are then planarized using chemical-mechanical polishing until the sacrificial material has been substantially, completely removed.

22 Claims, 2 Drawing Sheets

METHOD FOR PLANARIZING A THIN FILM

BACKGROUND OF THE INVENTION

1. Field of the Invention

The present invention relates to a method for chemical-mechanical polishing and, more particularly, to a method for chemical-mechanical polishing to form a thin film.

2. Description of the Related Art

During the fabrication of many semiconductor circuits, the individual devices that make up the circuits are fabricated, in part, by forming a number of layers of material on a wafer and then selectively etching one or more of the layers of material to leave the individual devices. The result of this etch step, however, produces a severe topology with the individual devices forming high points and the etched-away portions forming low points.

FIG. 1 shows a cross-sectional diagram that illustrates a prior-art processed wafer 100 following the etch step that defines the individual devices that make up the circuits on wafer 100. As shown in FIG. 1, wafer 100 has a number of individual devices 110 and a number of etched-away portions 112. In addition, wafer 100 has a top surface 114 with high points defined by the top surfaces of the individual devices 110 and low points defined by the top surfaces of the etched-away portions 112.

One problem with a severe topology is that it is difficult to form a thin, planarized layer of polysilicon on this type of surface. A thin, planarized layer of polysilicon can be used to implement, for example, a local interconnect line. One well-known technique for forming planarized surfaces is known as chemical-mechanical polishing (CMP).

With CMP, an uneven surface is both chemically reacted and mechanically ground to bring down the surface until a substantially flat surface is formed. Conventional CMP processes, however, are subject to dishing, a term that refers to low spots in an otherwise relatively flat surface.

If a layer of polysilicon is deposited on the surface of a processed wafer, such as wafer 100, using conventional deposition techniques, and then planarized using conventional CMP processes, dishing tends to remove a significant amount of polysilicon from the top edges of the individual devices. FIGS. 2A and 2B shows cross-sectional diagrams that illustrate the conventional deposition of polysilicon and subsequent planarization using CMP processes.

As shown in FIG. 2A, conventional deposition techniques have been used to form a layer of polysilicon 210 on the top surface 114 of wafer 100. Conventional CMP planarization requires overdepositing of the material to be planarized by 2x-3x the required final thickness. For example, oxide is typically deposited to a thickness of 12K-18K angstroms to obtain a final thickness of 6.5K angstroms.

Current-generation deposition equipment limits the maximum thickness of the deposited polysilicon to approximately 5K angstroms. (Thicker layers of polysilicon produce film stresses that deform the wafer.) Thus, a final thickness of approximately 2.5K angstroms is the maximum thickness obtainable with current-generation equipment.

Next, as shown in FIG. 2B, polysilicon layer 210 is planarized using chemical-mechanical polishing (CMP) until a thin, substantially-flat layer of polysilicon remains on the surfaces of devices 110. As further shown in FIG. 2B, the CMP process tends to remove more polysilicon at the edges of the top surfaces of devices 110 than at the centers.

This can lead to degraded device performance where the polysilicon has been thinned as shown by arrow A, to an outright open circuit where the polysilicon has been completely removed at the edges as shown by arrow B. Thus, there is a need for a method of forming a thin, planarized layer of polysilicon on the devices which is not subject to polysilicon thinning at the edges of the top surfaces of the devices.

SUMMARY OF THE INVENTION

A method of planarizing a layer of semiconductor material formed on a wafer is disclosed in accordance with a first embodiment of the present invention. The wafer has a top surface, and the top surface has a first region and a second region that lies above the first region. The first region is equal to a lowest part of the top surface. The second region is equal to a highest part of the top surface.

The method includes forming a layer of first material to contact the top surface of the wafer. The layer of first material has a top surface, and the top surface of the layer of first material has a first region and a second region that lies above the first region of the layer of first material. The first region of the layer of first material is equal to a lowest part of the top surface of the layer of first material. The second region of the layer of first material is equal to a highest part of the top surface of the layer of first material.

The method also includes forming a layer of second material to contact the top surface of the layer of first material. The layer of second material has a top surface, and the top surface of the layer of second material has a first region and a second region that lies above the first region of the layer of second material. The first region of the layer of second material is equal to a lowest part of the top surface of the layer of second material. The second region of the layer of second material is equal to a highest part of the top surface of the layer of second material. The first region of the top surface of the layer of second material lies above the second region of the top surface of the layer of first material.

The method further includes performing a chemical-mechanical polish of the layer of second material and the layer of first material. The chemical-mechanical polish continues until the layer of second material has been substantially all removed from the layer of first material, thereby forming the layer of first material to have a substantially planar top surface. The substantially planar top surface of the layer of first material lies over the first region and the second region of the top surface of the wafer.

A method of planarizing a layer of semiconductor material formed on a wafer is disclosed in accordance with a second embodiment of the present invention. The wafer has a top surface, and the top surface has a first region and a second region that lies above the first region. The first region is equal to a lowest part of the top surface. The second region is equal to a highest part of the top surface.

The method includes conformally forming a layer of first material to contact the top surface of the wafer. The layer of first material has a top surface, and the top surface of the layer of first material has a first region and a second region that lies above the first region of the layer of first material. The first region of the layer of first material is equal to a lowest part of the top surface of the layer of first material. The second region of the layer of first material is equal to a highest part of the top surface of the layer of first material.

The method also includes forming a layer of second material to contact and adhere to the top surface of the layer of first material. The method further includes performing a chemical-mechanical polish of the layer of second material and the layer of first material. The chemical-mechanical polish continues until the layer of second material has been substantially all removed from the layer of first material at which time the layer of first material has a substantially planar top surface. The substantially planar top surface of the layer of first material lies over the second region of the top surface of the wafer.

A better understanding of the features and advantages of the present invention will be obtained by reference to the following detailed description and accompanying drawings that set forth an illustrative embodiment in which the principles of the invention are utilized.

DETAILED DESCRIPTION

Figure 1:
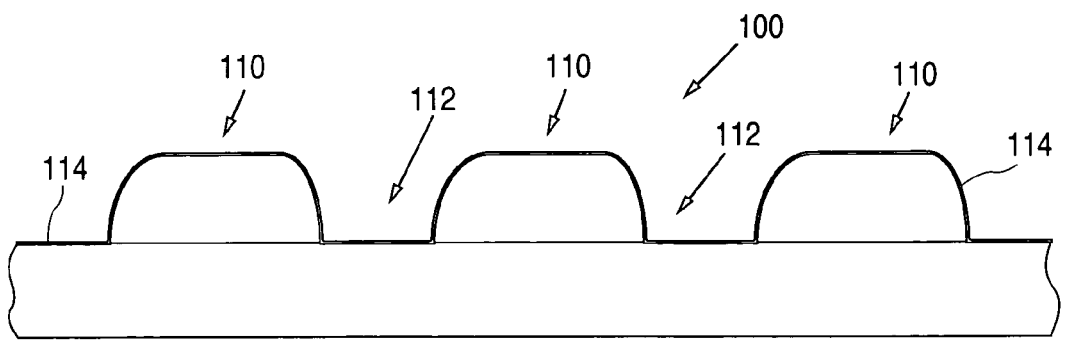
FIG. 1 is a cross-sectional diagram illustrating a prior-art processed wafer 100 following the etch step that defines the individual devices that make up the circuits on wafer 100.
Figure 2A:
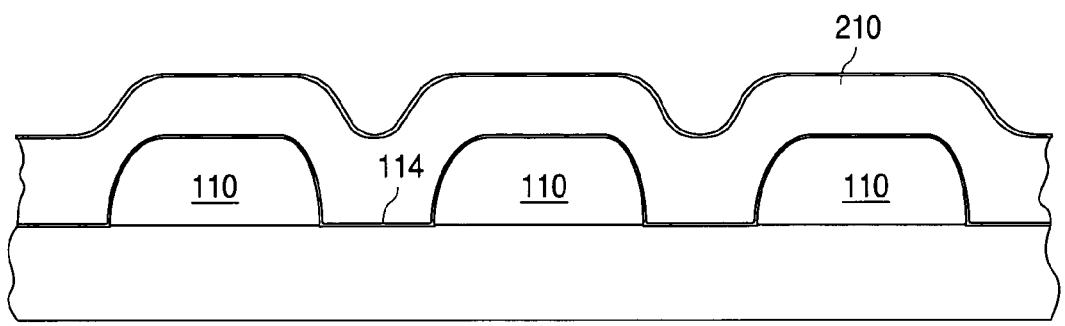
FIGS. 2A and 2B are cross-sectional diagrams illustrating the conventional deposition of polysilicon and subsequent planarization using CMP processes.
Figure 2B:
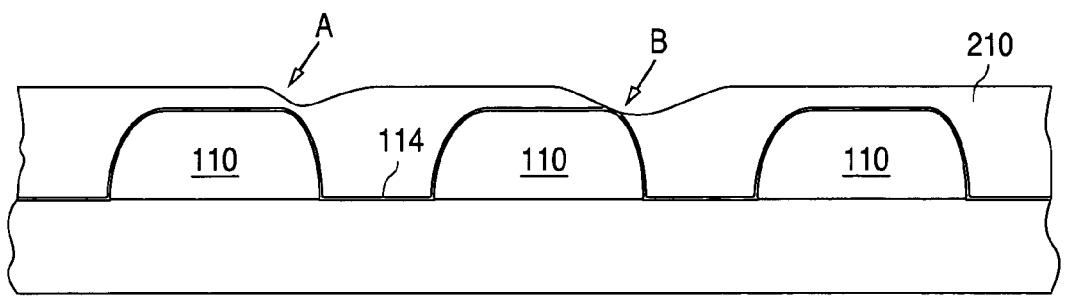
Figure 3D:
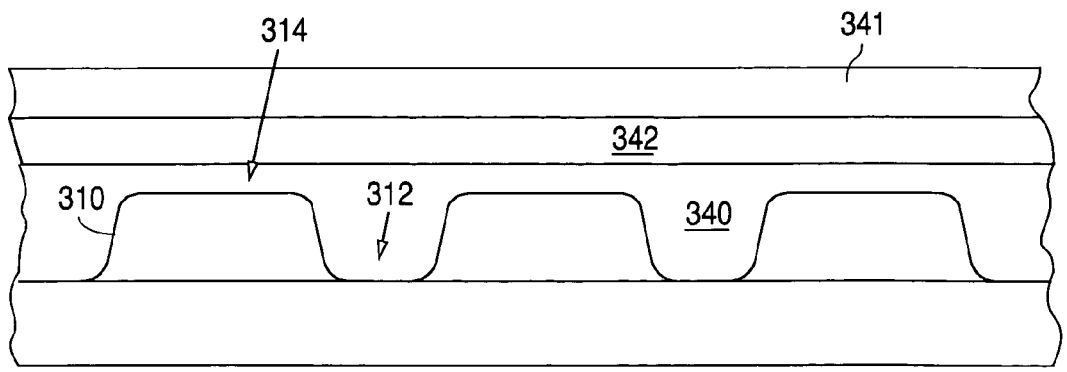
FIGS. 3A-3D are cross-sectional drawings illustrating a method of forming a thin, planarized layer of polysilicon in accordance with the present invention.
Figure 3A:
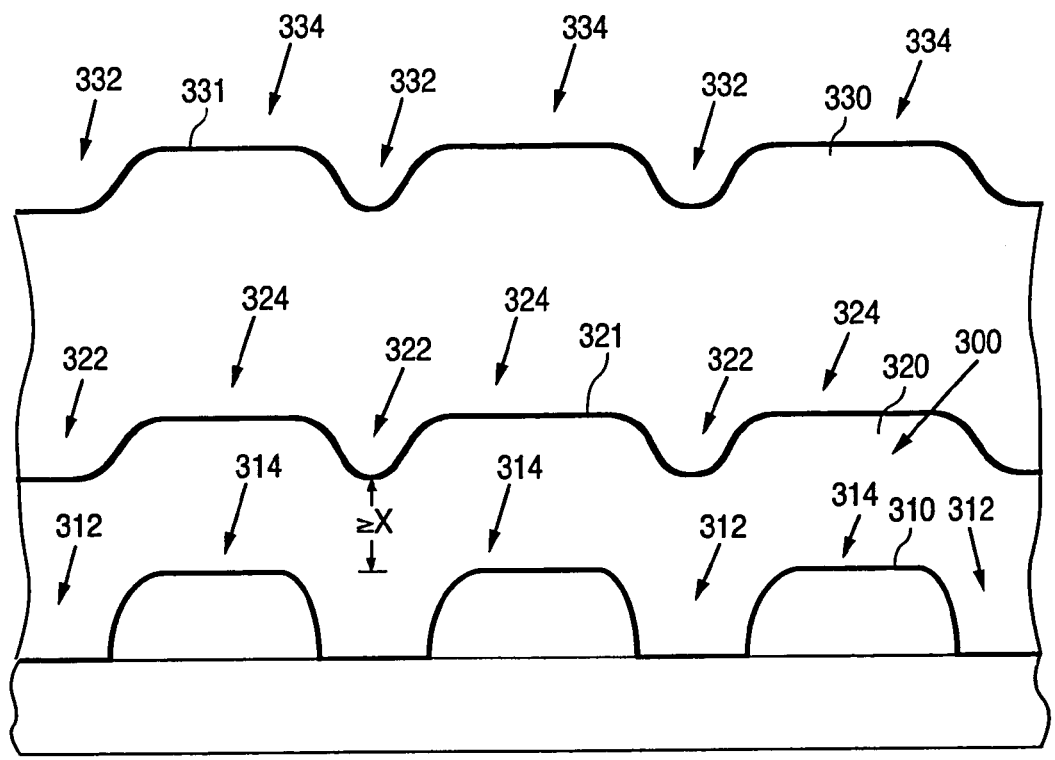

FIGS. 3A-3D show cross-sectional drawings that illustrate a method of forming a thin, planarized layer of polysilicon in accordance with the present invention. As shown in FIG. 3A, the method utilizes a conventionally processed semiconductor wafer 300 that has a top surface 310. Surface 310, in turn, has a number of substantially-equal lower levels 312 and a number of substantially-equal upper levels 314 that lie above the lower levels 312.

As further shown in FIG. 3A, the method begins by depositing a layer of polysilicon 320 on surface 310. Polysilicon layer 320 is conformally deposited and, as a result, also has a top surface 321 that has a number of substantially-equal lower levels 322 and a number of substantially-equal upper levels 324 that lie above the lower levels 322.

Next, polysilicon layer 320 is conventionally doped. (Alternately, a doped layer of polysilicon can be formed in lieu of separate deposition and doping steps.) Following this, a layer of sacrificial oxide 330 is formed on polysilicon layer 320. Oxide layer 330 is also conformally formed and, like polysilicon layer 320, has a top surface 331 that has a number of substantially-equal lower levels 332 and a number of substantially-equal upper levels 334 that lie above the lower levels 332.

Figure 3B:
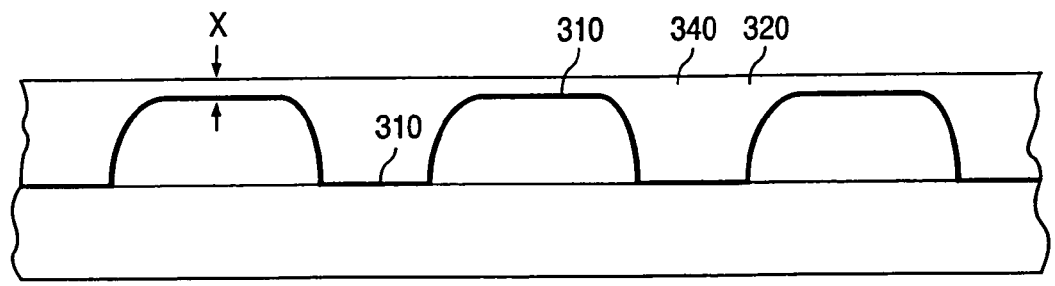
Figure 3C:
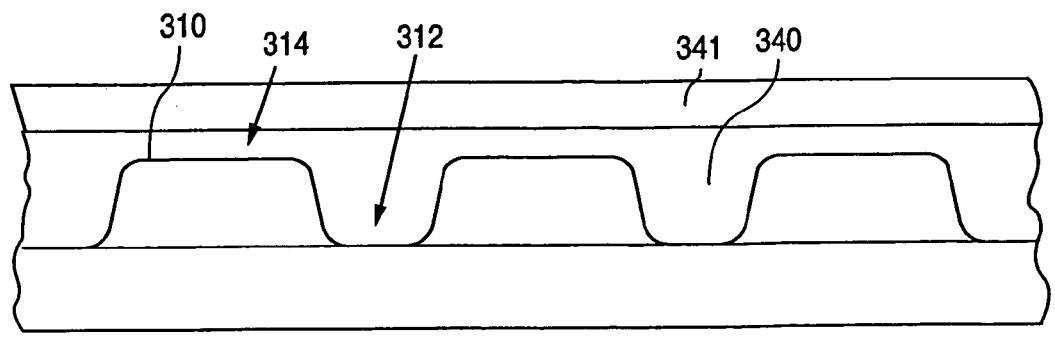

After this, as shown in FIG. 3B, oxide layer 330 and polysilicon layer 320 are chemically-mechanically polished until oxide layer 330 is substantially, completely removed from the surface of polysilicon layer 320 to form a planarized layer of polysilicon 340. Once planarized polysilicon layer 340 has been formed, as shown in FIG. 3C, a mask 341 is formed and patterned on planarized polysilicon layer 340.

Next, planarized polysilicon layer 340 is etched to form a number of structures, such as local interconnect lines, that are electrically connected to individual devices on wafer 300. (The locations where the structures make electrical contacts with the individual devices of wafer 300 are prepared before polysilicon layer 320 is deposited, and are assumed to be a part of wafer 300.)

Alternately, after the planarization step, one or more additional layers of material, such as materials which lower the resistance of polysilicon, can be formed over layer 340. As shown in FIG. 3D, a layer of material 342 is formed over is formed over planarized polysilicon layer 340. Mask 341 is then formed and patterned on the additional layers of material (e.g., layer 342) which are then etched along with planarized polysilicon layer 340 to form the structures (e.g., local interconnect lines). Either way, once the structures have been formed, the method continues with conventional back-end processing steps.

When the structures are formed, the structures are specified to have a thickness over the upper levels 314 that ranges from a minimum thickness to a maximum thickness. To achieve this result, polysilicon layer 320 is deposited to have a thickness such that lower level 322 is above upper level 314 by an amount which is at least as great as the minimum specified thickness of the resulting structures.

For example, if the minimum allowable thickness of the resulting structures over upper levels 314 is X (see FIG. 3B), then polysilicon layer 320 must be deposited so that lower level 322 is above upper level 314 by a value that is equal to or greater than the distance X (see FIG. 3A). (If the polishing is timed using experimentally derived values, then polysilicon layer 320 is deposited so that lower level 322 is above upper level 314 by more than the distance X. This allows polysilicon layer 320 to be slightly over etched to insure that oxide layer 330 has been removed while still meeting the minimum requirements for the thickness of the resulting structures.)

In addition, oxide layer 330 is formed to have a thickness such that the combined thickness of polysilicon layer 320 and oxide layer 330 is approximately 2×-3× the required final thickness of the polysilicon layer. (Thicker layers of oxide can be used, but to no apparent advantage.)

Oxide layer 330 and polysilicon layer 320 are chemically-mechanically polished with a slurry that ideally has a selectivity of 1:1 (removes oxide layer 330 at the same rate as polysilicon layer 320). In the present invention, slurries that fall within a range of approximately 0.9-1.1:1 can also be used. This approximate range is a critical range in that slurries that fall well outside of this range produce unacceptable dishing. (Slurries with a selectivity of 1.1:1 are commercially available.)

Although described with respect to polysilicon and oxide, materials other than oxide can alternately be used as a sacrificial material if the material can be removed with a slurry that has a selectivity in the range of 0.9-1.1:1. In addition, the present invention applies to other thin films that can not be planarized using chemical-mechanical polishing. In this case, the other thin-film is combined with a material that can be removed with a slurry that has a selectivity in the range of 0.9-1.1:1.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A method of planarizing a layer of semiconductor material formed on a wafer, the wafer having a top surface, the top surface having a first region and a second region that lies above the first region, the first region being equal to a lowest part of the top surface, the second region being equal to a highest part of the top surface, the method comprising:

forming a layer of first material to contact the top surface of the wafer, the layer of first material having a top surface, the top surface of the layer of first material having a first region and a second region that lies above the first region of the layer of first material, the first region of the layer of first material being equal to a lowest part of the top surface of the layer of first material, the second region of the layer of first material being equal to a highest part of the top surface of the layer of first material;
forming a layer of second material to contact the top surface of the layer of first material, the layer of second material having a top surface, the top surface of the layer of second material having a first region and a second region that lies above the first region of the layer of second material, the first region of the layer of second material being equal to a lowest part of the top surface of the layer of second material, the second region of the layer of second material being equal to a highest part of the top surface of the layer of second material, the first region of the top surface of the layer of second material lying above the second region of the top surface of the layer of first material; and
performing a chemical-mechanical polish of the layer of second material and the layer of first material, the chemical-mechanical polish continuing until the layer of second material has been substantially all removed from the layer of first material, thereby forming the layer of first material to have a substantially planar top surface, the substantially planar top surface of the layer of first material lying over the first region and the second region of the top surface of the wafer.

2. The method of claim 1 wherein:
the substantially planar top surface of the layer of first material has a first thickness over the second region of the top surface of the wafer, and
the layer of first material is formed such that the first region of the top surface of the layer of first material lies above the second region of the top surface of the wafer by a second thickness that is equal to or greater than the first thickness.

3. The method of claim 1 wherein the layer of first material is conductive and electrically connected to a device on the wafer.

4. The method of claim 3 wherein the layer of first material is polysilicon.

5. The method of claim 4 and further comprising doping the layer of polysilicon prior to forming the layer of second material.

6. The method of claim 3 wherein the layer of second material is non-conductive.

7. The method of claim 1 wherein the chemical-mechanical polish removes the layer of first material and the layer of second material at approximately a same rate.

8. The method of claim 1 and further comprising forming a layer of third material over the substantially planar top surface of the layer of first material, the third layer of material lying above and being vertically spaced apart from the second region of the top surface of the wafer.

9. The method of claim 8 wherein the layer of third material is a mask.

10. The method of claim 8 wherein:
the substantially planar top surface of the layer of first material includes doped polysilicon; and
the layer of third material lowers a resistance of doped polysilicon.

11. The method of claim 10 and further comprising forming a mask on the layer of third material.

12. A method of planarizing a layer of semiconductor material formed on a wafer, the wafer having a top surface, the top surface having a first region and a second region that lies above the first region, the first region being equal to a lowest part of the top surface, the second region being equal to a highest part of the top surface, the method comprising:
conformally forming a layer of first material to contact the top surface of the wafer, the layer of first material having a top surface, the top surface of the layer of first material having a first region and a second region that lies above the first region of the layer of first material, the first region of the layer of first material being equal to a lowest part of the top surface of the layer of first material, the second region of the layer of first material being equal to a highest part of the top surface of the layer of first material;
forming a layer of second material to contact and adhere to the top surface of the layer of first material; and
performing a chemical-mechanical polish of the layer of second material and the layer of first material, the chemical-mechanical polish continuing until the layer of second material has been substantially all removed from the layer of first material at which time the layer of first material has a substantially planar top surface, the substantially planar top surface of the layer of first material lying over the second region of the top surface of the wafer.

13. The method of claim 12 wherein:
the substantially planar top surface of the layer of first material has a first thickness over the second region of the top surface of the wafer, and
the layer of first material is formed such that the first region of the top surface of the layer of first material lies above the second region of the top surface of the wafer by a second thickness that is equal to or greater than the first thickness.

14. The method of claim 12 wherein the layer of first material is conductive and electrically connected to a device on the wafer.

15. The method of claim 14 wherein the layer of first material is polysilicon.

16. The method of claim 15 and further comprising doping the layer of polysilicon prior to forming the layer of second material.

17. The method of claim 14 wherein the layer of second material is non-conductive.

18. The method of claim 12 wherein the chemical-mechanical polish removes the layer of first material and the layer of second material at approximately a same rate.

19. The method of claim 12 and further comprising forming a layer of third material over the substantially planar top surface of the layer of first material, the third layer of material lying above and being vertically spaced apart from the second region of the top surface of the wafer.

20. The method of claim 19 wherein the layer of third material is a mask.

21. The method of claim 19 wherein:
the substantially planar top surface of the layer of first material includes doped polysilicon; and
the layer of third material lowers a resistance of doped polysilicon.

22. The method of claim 21 and further comprising forming a mask on the layer of third material.

* * * * *